United States Patent
Imagawa

(10) Patent No.: US 11,500,009 B2
(45) Date of Patent: Nov. 15, 2022

(54) TESTING APPARATUS, TESTING METHOD, AND MANUFACTURING METHOD

(71) Applicant: FUJI ELECTRIC CO., LTD., Kanagawa (JP)

(72) Inventor: Tetsutaro Imagawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/356,574

(22) Filed: Jun. 24, 2021

(65) Prior Publication Data

US 2022/0065917 A1 Mar. 3, 2022

(30) Foreign Application Priority Data

Aug. 26, 2020 (JP) .............................. JP2020-143019

(51) Int. Cl.
| | |
|---|---|
| *G01R 31/26* | (2020.01) |
| *H01L 29/08* | (2006.01) |
| *H01L 29/10* | (2006.01) |
| *H01L 27/06* | (2006.01) |
| *H01L 29/739* | (2006.01) |
| *H01L 29/861* | (2006.01) |
| *H01L 29/40* | (2006.01) |

(52) U.S. Cl.
CPC ...... *G01R 31/2617* (2013.01); *H01L 27/0664* (2013.01); *H01L 29/0834* (2013.01); *H01L 29/1095* (2013.01); *H01L 29/407* (2013.01); *H01L 29/7397* (2013.01); *H01L 29/8613* (2013.01)

(58) Field of Classification Search
CPC ............ G01R 31/2617; G01R 31/2601; G01R 31/2608; G01R 31/2621; G01R 31/2632; H01L 27/0664; H01L 27/0727; H01L 29/407; H01L 29/7397; H01L 29/0834; H01L 29/8613; H01L 29/1095
See application file for complete search history.

(56) References Cited

U.S. PATENT DOCUMENTS

| | | | | |
|---|---|---|---|---|
| 5,502,399 | A | * | 3/1996 | Imai ................. G01R 31/31701 324/762.09 |
| 2013/0320903 | A1 | * | 12/2013 | Aalund ............... H02P 29/0241 318/490 |
| 2016/0356838 | A1 | * | 12/2016 | Sicard ................ H03K 17/0828 |

(Continued)

FOREIGN PATENT DOCUMENTS

WO 2018092457 A1 5/2018

*Primary Examiner* — Thang X Le

(57) ABSTRACT

Provided is a testing apparatus for testing a semiconductor device including a first main terminal to which a first power source voltage is applied and a second main terminal to which a second power source voltage is applied, comprising: a condition setting unit for setting a changing speed of a terminal voltage of the first main terminal at turn-off of the device; an operation controlling unit for turning off the device under a condition set by the condition setting unit; and a determining unit for screening the device based on an operation result of the device, wherein: a time waveform of the terminal voltage at turn-off of the device includes a maximum changing point where a changing speed becomes maximum; and the condition setting unit sets the changing speed at a first set voltage higher than a voltage at the maximum changing point, to a predetermined value.

20 Claims, 7 Drawing Sheets

(56) References Cited

U.S. PATENT DOCUMENTS

2018/0172749 A1* 6/2018 Igarashi .................. G05F 1/625
2019/0064249 A1 2/2019 Yoshida
2020/0343715 A1* 10/2020 Kaeriyama ............ G01R 31/40

* cited by examiner

TESTING APPARATUS, TESTING METHOD, AND MANUFACTURING METHOD

The contents of the following Japanese patent application are incorporated herein by reference:
NO. 2020-143019 filed in JP on Aug. 26, 2020.

BACKGROUND

1. Technical Field

The present invention relates to a testing apparatus, a testing method, and a manufacturing method.

2. Related Art

As a test of a semiconductor device such as an insulated gate bipolar transistor (IGBT), a test for measuring a changing speed (also referred to as dV/dt) of voltage at turn-off of the semiconductor device is known in the prior art (for example, see Patent Document 1).
Patent Document 1: WO2018/092457

SUMMARY

Technical Problem

In a test of semiconductor device, it is preferable that the semiconductor device can be screened with high accuracy.

Technical Solution

According to one aspect of the present invention, a testing apparatus for testing a semiconductor device is provided in order to solve the above-mentioned problem. The semiconductor device may include a first main terminal to which a first power source voltage is applied, and a second main terminal to which a second power source voltage lower than the first power source voltage is applied. The testing apparatus may include a condition setting unit for setting a changing speed of a terminal voltage of the first main terminal at turn-off of the semiconductor device. The testing apparatus may include an operation controlling unit for turning off the semiconductor device under a condition set by the condition setting unit. The testing apparatus may include a determining unit for screening the semiconductor device based on an operation result of the semiconductor device. A time waveform of the terminal voltage at turn-off of the semiconductor device may include a maximum changing point where the changing speed becomes maximum. The condition setting unit may set the changing speed at a first set voltage higher than a voltage at the maximum changing point, to a predetermined value.

The first set voltage may be a voltage equal to or higher than 80% of the first power source voltage.

The first set voltage may be a voltage equal to or higher than the first power source voltage.

The first set voltage may be the same voltage as the first power source voltage.

The testing apparatus may test the semiconductor device in each of two cases: a case where the semiconductor device is in a chip state and a case where it is in a module state. The condition setting unit may set the changing speed at the first set voltage when testing the semiconductor device in the chip state, higher than the changing speed at the first set voltage when testing the semiconductor device in the module state.

The condition setting unit may adjust the changing speed at the first set voltage for the semiconductor device in the chip state according to a result of screening the semiconductor device in the module state.

The condition setting unit may increase the changing speed at the first set voltage for the semiconductor device in the chip state, when a fraction defective in the semiconductor device in the module state is increased.

The condition setting unit may further set the changing speed at a second set voltage different from the first set voltage, to a predetermined value.

The second set voltage may be lower than the first set voltage.

According to a second aspect of the present invention, a testing method for testing a semiconductor device is provided. The semiconductor device may include a first main terminal to which a first power source voltage is applied, and a second main terminal to which a second power source voltage lower than the first power source voltage is applied. The testing method may include a condition setting step of setting a changing speed of a terminal voltage of the first main terminal at turn-off of the semiconductor device. The testing method may include an operation controlling step of turning off the semiconductor device under a condition set in the condition setting step. The testing method may include a determining step of screening the semiconductor device based on an operation result of the semiconductor device. A time waveform of the terminal voltage at turn-off of the semiconductor device may include a maximum changing point where the changing speed becomes maximum. In the condition setting step, the changing speed at the first set voltage higher than the voltage at the maximum changing point may be set to a predetermined value.

According to a third aspect of the present invention, a manufacturing method of a semiconductor module including a semiconductor device is provided. The semiconductor device may include a first main terminal to which a first power source voltage is applied, and a second main terminal to which a second power source voltage lower than the first power source voltage is applied. The manufacturing method may include a testing step of testing the semiconductor device in the chip state. The manufacturing method may include an incorporating step of incorporating into a module the semiconductor device sorted in the testing step so as to form the semiconductor module. The testing step may include a condition setting step of setting a changing speed of a terminal voltage of the first main terminal at turn-off of the semiconductor device. The testing step may include an operation controlling step of turning off the semiconductor device under a condition set in the condition setting step. The testing step may include a determining step of screening the semiconductor device based on an operation result of the semiconductor device. A time waveform of the terminal voltage at turn-off of the semiconductor device may include a maximum changing point where the changing speed becomes maximum. In the condition setting step, the changing speed at the first set voltage higher than the voltage at the maximum changing point may be set to a predetermined value.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the claimed invention. Moreover, not all combinations of features described in the embodiments are necessary to solutions of the invention.

Figure 1:
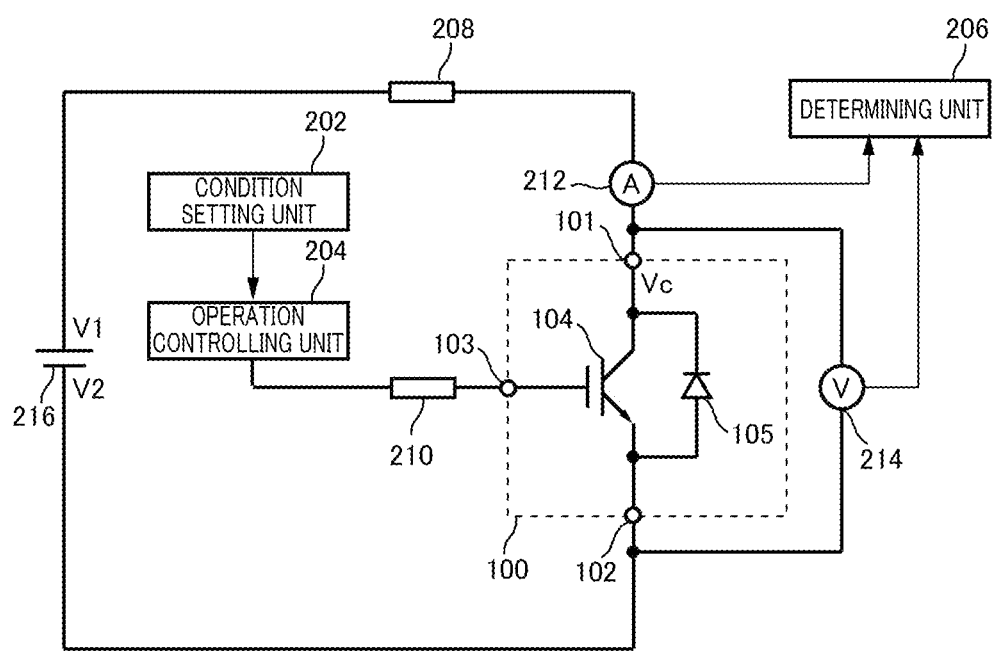
FIG. 1 shows an example of a testing apparatus 200 for testing a semiconductor device 100.

FIG. 1 shows an example of a testing apparatus 200 for testing a semiconductor device 100. The semiconductor device 100 is a device including a switching device such as an IGBT. The semiconductor device 100 in this example includes a transistor 104 and a diode 105 electrically connected in parallel. The transistor 104 is, for example, an IGBT, and the diode 105 is, for example, a freewheeling diode (FWD). In this example, a cathode of the diode 105 is connected to a collector of the transistor 104, and an anode of the diode 105 is connected to an emitter of the transistor 104. The transistor 104 and the diode 105 are formed in the same semiconductor substrate.

The semiconductor device 100 in this example includes a first main terminal 101, a second main terminal 102, and a control terminal 103. A first power source voltage V1 is applied to the first main terminal 101, and a second power source voltage V2 lower than the first power source voltage V1 is applied to the second main terminal 102. The second power source voltage V2 may be a ground potential. A control signal for controlling a switching operation of the semiconductor device 100 is applied to the control terminal 103.

The first main terminal 101 may be a collector pad provided on a surface of the semiconductor device 100. The first main terminal 101 in this example is electrically connected to the collector of the transistor 104 and the cathode of the diode 105. The second main terminal 102 may be an emitter pad provided on the surface of the semiconductor device 100. The second main terminal 102 in this example is electrically connected to the emitter of the transistor 104 and the anode of the diode 105. The control terminal 103 may be a gate pad provided on the surface of the semiconductor device 100. The control terminal 103 in this example is electrically connected to a gate of the transistor 104. The transistor 104 is switched in response to the control signal input to the control terminal 103, and whether a principal current flows between the first main terminal 101 and the second main terminal 102 is switched.

The testing apparatus 200 screens the semiconductor device 100, based on a state of the semiconductor device 100 when the semiconductor device 100 is transitioned (also referred to as turned off) from an ON-state to an OFF-state under a predetermined condition. The testing apparatus 200 determines the semiconductor device 100 that has gone into a predetermined state at turn-off, as a defective. For example, the testing apparatus 200 removes the semiconductor device 100 that has been destroyed such as due to excessive current flowing at turn-off, as a defective. This allows, in a manufacturing process of the semiconductor device 100, the screened non-defective semiconductor device 100 to be passed to a subsequent process. The test of the semiconductor device 100 may be conducted at a room temperature (25° C.), or may be conducted at another ambient temperature.

The testing apparatus 200 includes a condition setting unit 202, an operation controlling unit 204, and a determining unit 206. One computer may serve as the condition setting unit 202, the operation controlling unit 204, and the determining unit 206, or a plurality of computers may cooperate to serve as the condition setting unit 202, the operation controlling unit 204, and the determining unit 206. The computers may store a program for serving as the condition setting unit 202, the operation controlling unit 204, and the determining unit 206.

The testing apparatus 200 may further include a power source 216, a circuit element 208, a gate resistor 210, an ammeter 212, and a voltmeter 214. The power source 216 generates the first power source voltage V1 and the second power source voltage V2 to apply them to the semiconductor device 100. The circuit element 208 includes one or more electrical elements, and is provided between the power source 216 and the first main terminal 101. The circuit element 208 may include at least one of a resistor, a switch, an inductor, and a diode which are provided between the power source 216 and the first main terminal 101. The gate resistor 210 is an electrical resistor connected to the control terminal 103. The ammeter 212 measures a current flowing between the first main terminal 101 and the second main terminal 102. The voltmeter 214 measures a voltage between the first main terminal 101 and the second main terminal 102.

The condition setting unit 202 sets a changing speed (dV/dt) of a terminal voltage Vc of the first main terminal 101 at turn-off of the semiconductor device 100. The condition setting unit 202 may set the changing speed of the terminal voltage Vc by adjusting a waveform of the control signal input to the control terminal 103, or may set the changing speed of the terminal voltage Vc by adjusting a resistance value of the gate resistor 210.

The operation controlling unit 204 turns off the semiconductor device 100 under a condition set by the condition setting unit 202. The operation controlling unit 204 may input the control signal having the waveform set by the condition setting unit 202, to the control terminal 103 via the gate resistor 210. Moreover, the operation controlling unit 204 may input the control signal to the control terminal 103 via the gate resistor 210 whose resistance value is adjusted by the condition setting unit 202.

The determining unit 206 screens the semiconductor device 100 based on an operation result at turn-off of the semiconductor device 100. The operation result may be a measurement result of at least one of the ammeter 212 and the voltmeter 214, may be a result of measuring an appearance of the semiconductor device 100, or may be another measurement result. The determining unit 206 may screen the semiconductor device 100 based on whether a current or a voltage at turn-off of the semiconductor device 100 is within a predetermined range. Moreover, the determining unit 206 may determine, from the appearance of the semiconductor device 100, whether the semiconductor device 100 is destroyed or damaged.

Figure 2:
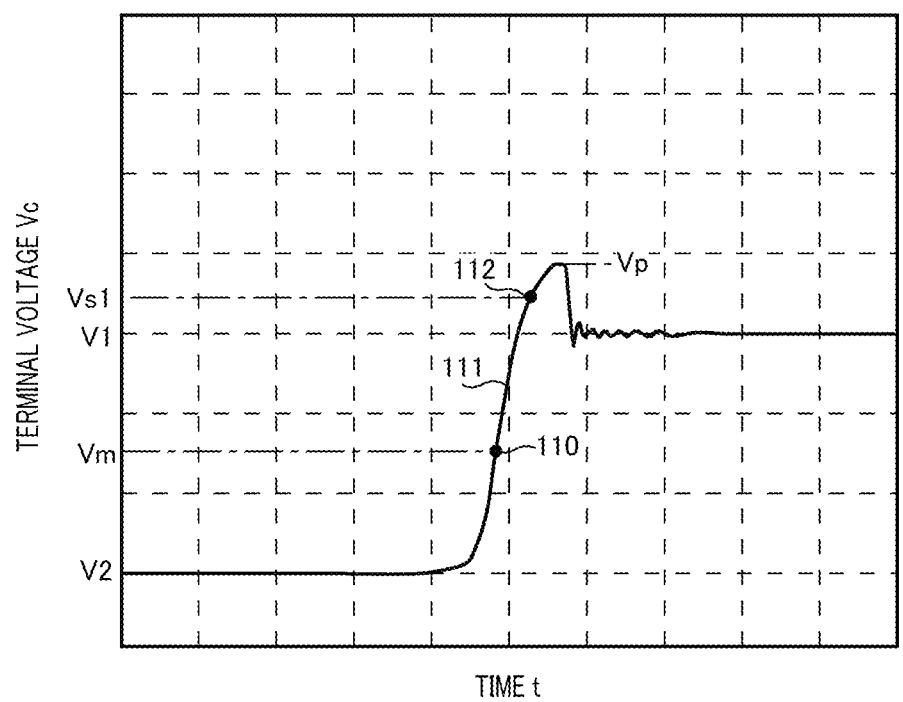
FIG. 2 shows an example of a time waveform of a terminal voltage Vc of a first main terminal 101 at turn-off.

FIG. 2 shows an example of a time waveform of the terminal voltage Vc of the first main terminal 101 at turn-off.

A horizontal axis in FIG. 2 represents the time, and a vertical axis represents the terminal voltage Vc. Since an ON-resistance of the semiconductor device 100 is much smaller than a resistance of the circuit element 208, the terminal voltage Vc of the first main terminal 101 becomes nearly equal to the second power source voltage V2 when the semiconductor device 100 is in the ON-state. Moreover, the terminal voltage Vc becomes nearly equal to the first power source voltage V1 when the semiconductor device 100 is turned off. However, by influence of a parasitic induction component or the like, at a rising part 111 from the second power source voltage V2, the terminal voltage Vc is converged to the first power source voltage V1 after being increased beyond the first power source voltage V1. A peak voltage of the terminal voltage Vc is defined as Vp. The rising part 111 is a waveform from a point where the terminal voltage Vc starts to be higher than the second power source voltage V2 to a point where the terminal voltage Vc becomes the peak voltage Vp.

The rising part 111 includes a maximum changing point 110 where the changing speed of the terminal voltage Vc becomes maximum within a range of the rising part 111. The changing speed is a value obtained by differentiating the terminal voltage Vc with time (dV/dt). That is, the changing speed is a point where the inclination of the rising part 111 becomes maximum. If the point where the changing speed becomes maximum is not clear, a point where the terminal voltage Vc becomes an intermediate voltage between the first power source voltage V1 and the second power source voltage V2 (that is, Vc=(V1−V2)/2) may be defined as the maximum changing point 110. The terminal voltage Vc at the maximum changing point 110 is defined as a voltage Vm.

The higher the changing speed of the terminal voltage Vc is, the more likely to be destroyed the semiconductor device 100 is. In the prior art, a turn-off test of the semiconductor device 100 has been sometimes conducted by adjusting the changing speed of the terminal voltage Vc at the maximum changing point 110 to a predetermined value. However, the semiconductor device 100 is likely to be destroyed in a region where the voltage applied to the semiconductor device 100, that is, the terminal voltage Vc is higher. Therefore, even if the semiconductor device 100 is tested while the changing speed of the terminal voltage Vc at the maximum changing point 110 is defined, it may not be possible to adequately screen the semiconductor device 100 which is destroyed at the terminal voltage Vc higher than the one at the maximum changing point 110. Therefore, the semiconductor device 100 which is supposed to be screened as a defective is passed to the subsequent process, and a fraction defective in the subsequent process is increased.

For example, the semiconductor device 100 may be incorporated into a module after screening the semiconductor device 100 in a chip state. In this case, if the semiconductor device 100 in the chip state cannot be adequately screened, the fraction defective when the semiconductor device 100 in a module state is tested is increased. When the semiconductor device 100 in the module state is defective, it must be discarded on a module-by-module basis, which has a great influence on the manufacturing cost.

The condition setting unit 202 in this example sets the changing speed of the terminal voltage Vc at a first set voltage Vs1 higher than the voltage Vm of the maximum changing point 110, to a predetermined reference value. As an example, the reference value may be 8 kV/second or more, or may be 10 kV/second or more. The first set voltage Vs is a voltage equal to or lower than the peak voltage Vp. At the rising part 111, a point where the terminal voltage Vc becomes the first set voltage Vs1 is defined as a first set point 112. The condition setting unit 202 may adjust the waveform of the control signal or the resistance value of the gate resistor 210, such that a difference between the changing speed of the terminal voltage Vc at the first set point 112 and the reference value is equal to or smaller than a predetermined value. The condition setting unit 202 may adjust the waveform of the control signal or the resistance value of the gate resistor 210 based on the time waveform of the terminal voltage Vc measured by the voltmeter 214. Moreover, the condition setting unit 202 may commonly use the set condition in a test on a plurality of semiconductor devices 100 of the same type.

According to this example, the turn-off test of the semiconductor device 100 is conducted while the changing speed of the terminal voltage Vc at the first set voltage Vs1 higher than the voltage Vm is defined. This allows the semiconductor device 100 whish is likely to be destroyed, to be screened with higher accuracy. Therefore, the fraction defective in the subsequent process can be reduced, and the manufacturing cost can be reduced.

The first set voltage Vs1 may be a voltage equal to or higher than 80% of the first power source voltage V1. That is, Vs1≥0.8×V1 may be satisfied. The first set voltage Vs1 may be a voltage equal to or higher than 90% of the first power source voltage V1, or may be a voltage equal to or higher than the first power source voltage V1. The first set voltage Vs1 may be the same voltage as the first power source voltage V1, or may be a voltage higher than the first power source voltage V1. Increasing the first set voltage Vs1 can define the changing speed at the terminal voltage Vc at which the semiconductor device 100 is more likely to be destroyed. This allows the semiconductor device 100 to be screened with high accuracy.

Figure 3:
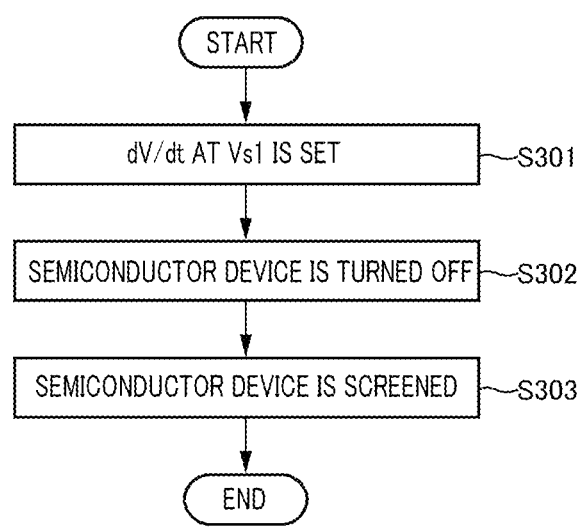
FIG. 3 is a flowchart showing an example of a testing method of the semiconductor device 100.

FIG. 3 is a flowchart showing an example of a testing method of the semiconductor device 100. In the testing method shown in FIG. 3, the semiconductor device 100 is tested by using the testing apparatus 200.

As described in FIG. 1 and FIG. 2, the condition setting unit 202 sets the changing speed of the terminal voltage Vc of the first main terminal 101 at turn-off of the semiconductor device 100 (condition setting step S301). In the condition setting step S301, the changing speed at the first set voltage Vs1 higher than the voltage Vm of the maximum changing point 110 is set to a predetermined value. Moreover, the operation controlling unit 204 turns off the semiconductor device 100 under a condition set in the condition setting step S301 (operation controlling step S302). Moreover, the determining unit 206 screens the semiconductor device 100 based on an operation result of the semiconductor device 100 (determining step S303).

As a comparative example, as a result of conducting a screening test on the semiconductor device 100 in the chip state while the changing speed of the terminal voltage Vc at the maximum changing point 110 is defined to a predetermined value, the fraction defective of the semiconductor device 100 in the chip state was 2.6%. Moreover, as a result of conducting a further screening test after incorporating the screened non-defective semiconductor device 100 into the module, the fraction defective of the semiconductor device 100 in the module state was 0.6%.

As an example embodiment, as a result of conducting a screening test on the semiconductor device 100 in the chip state while the changing speed of the terminal voltage Vc at the first set voltage Vs1 higher than the first power source voltage V1 is defined to a predetermined value, the fraction defective of the semiconductor device 100 in the chip state was 3.2%. Moreover, as a result of conducting a further screening test after incorporating the screened non-defective semiconductor device 100 into the module, the fraction defective of the semiconductor device 100 in the module state was 0.04%.

In the comparative example, a defect of 0.6% has occurred even in the semiconductor device 100 in the module state. That is, in the screening test on the semiconductor device 100 in the chip state, 0.6% of defective chips have been passed to the subsequent process. On the other hand, in the example embodiment, the fraction defective in the semiconductor device 100 in the module state was 0.04%, and it could be confirmed that the screening test on the semiconductor device 100 in the chip state had been able to be conducted with high accuracy.

Figure 4:
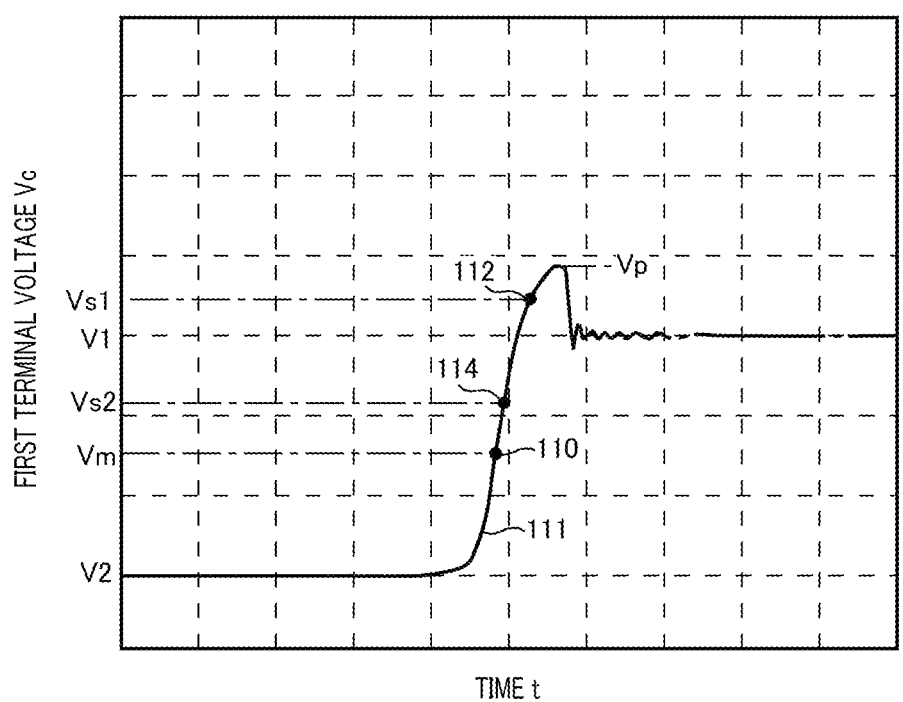
FIG. 4 shows another exemplary operation of a condition setting unit 202.

FIG. 4 shows another exemplary operation of a condition setting unit 202. The condition setting unit 202 in this example further sets the changing speed of the terminal voltage Vc at a second set voltage Vs2 different from the first set voltage Vs1, to a predetermined value. At the rising part 111, a point where the terminal voltage Vc becomes the second set voltage Vs2 is defined as a second set point 114. That is, the condition setting unit 202 may define the changing speed of the terminal voltage Vc at two points: the first set point 112 and the second set point 114. The changing speeds at the first set point 112 and the second set point 114 may be set to different values.

The second set voltage Vs2 in this example is lower than the first set voltage Vs1. The second set voltage Vs2 may be lower than the first power source voltage V1, and may be the same as the voltage Vm at the maximum changing point 110 or may be lower than the voltage Vm. This allows a shape of the rising part 111 to be defined with higher accuracy.

Figure 5:
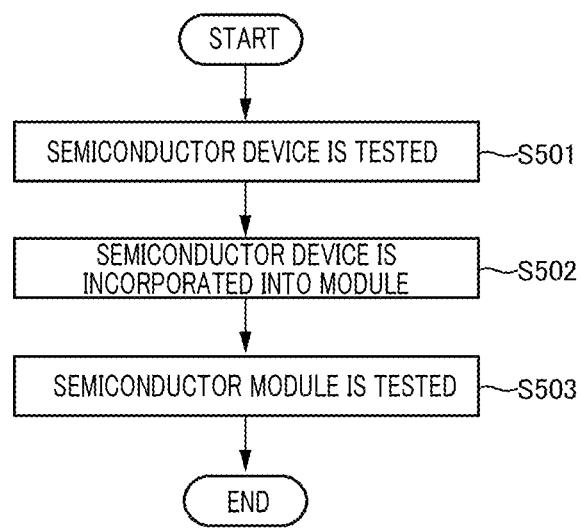
FIG. 5 is a flowchart showing an example of a manufacturing method of a semiconductor module.

FIG. 5 is a flowchart showing an example of a manufacturing method of a semiconductor module. The semiconductor module includes one or more semiconductor devices 100 in the chip state. First, in a first testing step S501, the semiconductor device 100 in the chip state is tested by using the testing apparatus 200. The chip state may be a state where the semiconductor device 100 is formed in one semiconductor substrate. The semiconductor device 100 may include a semiconductor substrate and a member such as an electrode fixed to a surface of the semiconductor substrate. In the first testing step S501, a test similar to the tests described in FIG. 1 to FIG. 4 is conducted.

Then, in an incorporating step S502, the semiconductor device 100 sorted as a non-defective in the first testing step S501 is incorporated into a module so as to form the semiconductor module. In the incorporating step S502, a predetermined electrical circuit may be formed by using the one or more semiconductor devices 100 in the chip state. In the incorporating step S502, this electrical circuit may be formed inside an enclosure formed of an insulating member such as resin.

Then, in a second testing step S503, the semiconductor module is tested. In the second testing step S503, a test similar to the tests described in FIG. 1 to FIG. 4 by using the testing apparatus 200 may be conducted on each semiconductor device 100 incorporated into the semiconductor module. Such process allows a non-defective semiconductor module to be manufactured.

The testing apparatus 200 in this example tests the semiconductor device 100 in each of two cases: a case where the semiconductor device 100 is in a chip state and a case where it is in a module state. The condition setting unit 202 may set the changing speed of the terminal voltage Vc at the first set voltage Vs1 when testing the semiconductor device 100 in the chip state, higher than the changing speed of the terminal voltage Vc at the first set voltage Vs1 when testing the semiconductor device 100 in the module state. That is, the condition setting unit 202 may set the inclination of the waveform of the terminal voltage Vc at the first set point 112 when testing the semiconductor device 100 in the chip state, steeper than the inclination of the waveform of the terminal voltage Vc at the first set point 112 when testing the semiconductor device 100 in the module state.

This allows the test on the semiconductor device 100 in the chip state to be executed under a condition where a defect is more likely to occur to the semiconductor device 100 than the test on the semiconductor device 100 in the module state. This can prevent the defective semiconductor device 100 from being passed to a process after the first testing step S501. Moreover, the first set voltage Vs1 when testing the semiconductor device 100 in the chip state may be set higher than the first set voltage Vs1 when testing the semiconductor device 100 in the module state. This also allows the test on the semiconductor device 100 in the chip state to be executed under a condition where a defect is more likely to occur to the semiconductor device 100 than the test on the semiconductor device 100 in the module state.

Moreover, the condition setting unit 202 may adjust the changing speed of the terminal voltage Vc at the first set voltage Vs1 of the first testing step S501 on the semiconductor device 100 of the same type, according to a result of a screening in the second testing step S503 (that is, the fraction defective in the semiconductor device 100 in the module state). The semiconductor device 100 of the same type is a semiconductor device having the same structure, a semiconductor device cut out from the same wafer, or the like. This allows the test result in the second testing step S503 to be fed back to the first testing step S501, to adjust the testing condition in the first testing step S501.

As an example, in the second testing step S503, the condition setting unit 202 may increase the changing speed of the terminal voltage Vc at the first set voltage Vs1 of the first testing step S501, when the fraction defective in the semiconductor device 100 in the module state is increased. The condition setting unit 202 may increase the changing speed of the terminal voltage Vc at the first set voltage Vs1 of the first testing step S501, when the fraction defective in the second testing step S503 exceeds a predetermined threshold. This allows the testing condition in the first testing step S501 to be adjusted such that the fraction defective in the second testing step S503 becomes smaller.

The condition setting unit 202 may also adjust the first set voltage Vs1 of the first testing step S501 on the semiconductor device 100 of the same type according to the fraction defective in the second testing step S503. As an example, in the second testing step S503, the condition setting unit 202 may increase the first set voltage Vs1 of the first testing step S501, when the fraction defective in the semiconductor device 100 in the module state is increased.

Figure 6:
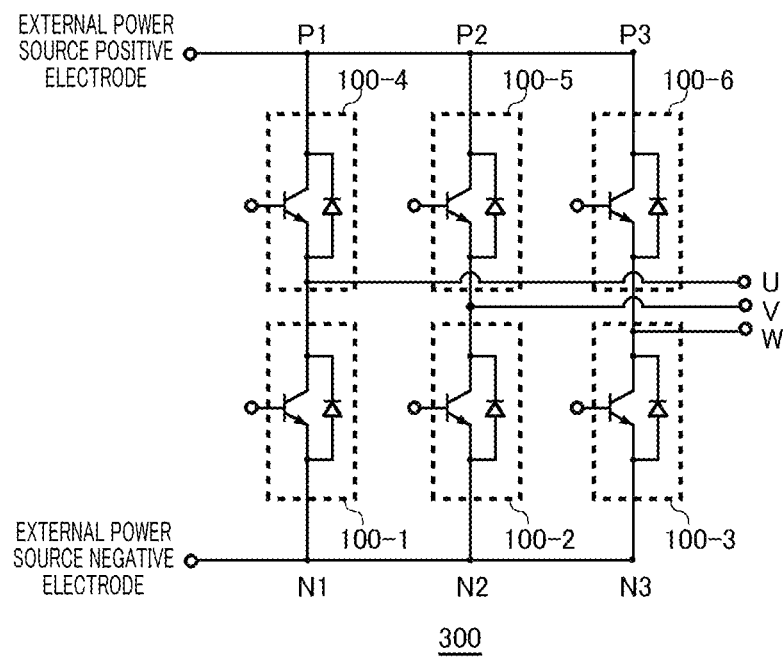
FIG. 6 is a circuit diagram showing an example of an electrical circuit included in a semiconductor module 300.

FIG. 6 is a circuit diagram showing an example of an electrical circuit included in a semiconductor module 300. In FIG. 6, an enclosure for housing the electrical circuit is omitted. Moreover, the electrical circuit included in the semiconductor module 300 is not limited to this example.

The semiconductor module 300 in this example may be a part of an in-vehicle unit for driving a vehicle motor. The semiconductor module 300 may serve as a three-phase AC inverter circuit having output terminals U, V, and W.

Semiconductor devices 100-1, 100-2, and 100-3 may form a lower arm in the semiconductor module 300, and a plurality of semiconductor devices 100-4, 100-5, and 100-6 may form an upper arm in the semiconductor module 300. A set of semiconductor devices 100-1, 100-4 may form a leg. A set of semiconductor devices 100-2, 100-5, and a set of semiconductor devices 100-3, 100-6 may also form legs. In the semiconductor device 100-1, an emitter and a collector may be electrically connected to an input terminal N1 and the output terminal U, respectively. In the semiconductor device 100-4, an emitter electrode and a collector electrode may be electrically connected to the output terminal U and an input terminal P1, respectively. Similarly, in the semiconductor devices 100-2, 100-3, emitter electrodes may be electrically connected to input terminals N2, N3, respectively, and collector electrodes may be electrically connected to the output terminals V, W, respectively. Further, in the semiconductor device 100-5, 100-6, emitter electrodes may be electrically connected to the output terminals V, W, respectively, and collector electrodes may be electrically connected to input terminals P2, P3, respectively.

Each of the semiconductor devices 100-1 to 100-6 may be alternately switched by a signal input to the control terminal of the semiconductor device 100. The input terminals P1, P2, and P3 may be connected to the positive electrode of an external power source, the input terminals N1, N2, and N3, may be connected to the negative electrode, and the output terminals U, V, and W may be connected to a load. The input terminals P1, P2, and P3 may be electrically connected to one another, and the other input terminals N1, N2, and N3 may also be electrically connected to one another.

In the semiconductor module 300, the plurality of semiconductor devices 100-1 to 100-6 may each be an RC-IGBT (reverse conducting IGBT) semiconductor chip. The plurality of semiconductor devices 100-1 to 100-6 may each include a combination of a diode and a transistor such as a MOSFET or an IGBT.

Figure 7:
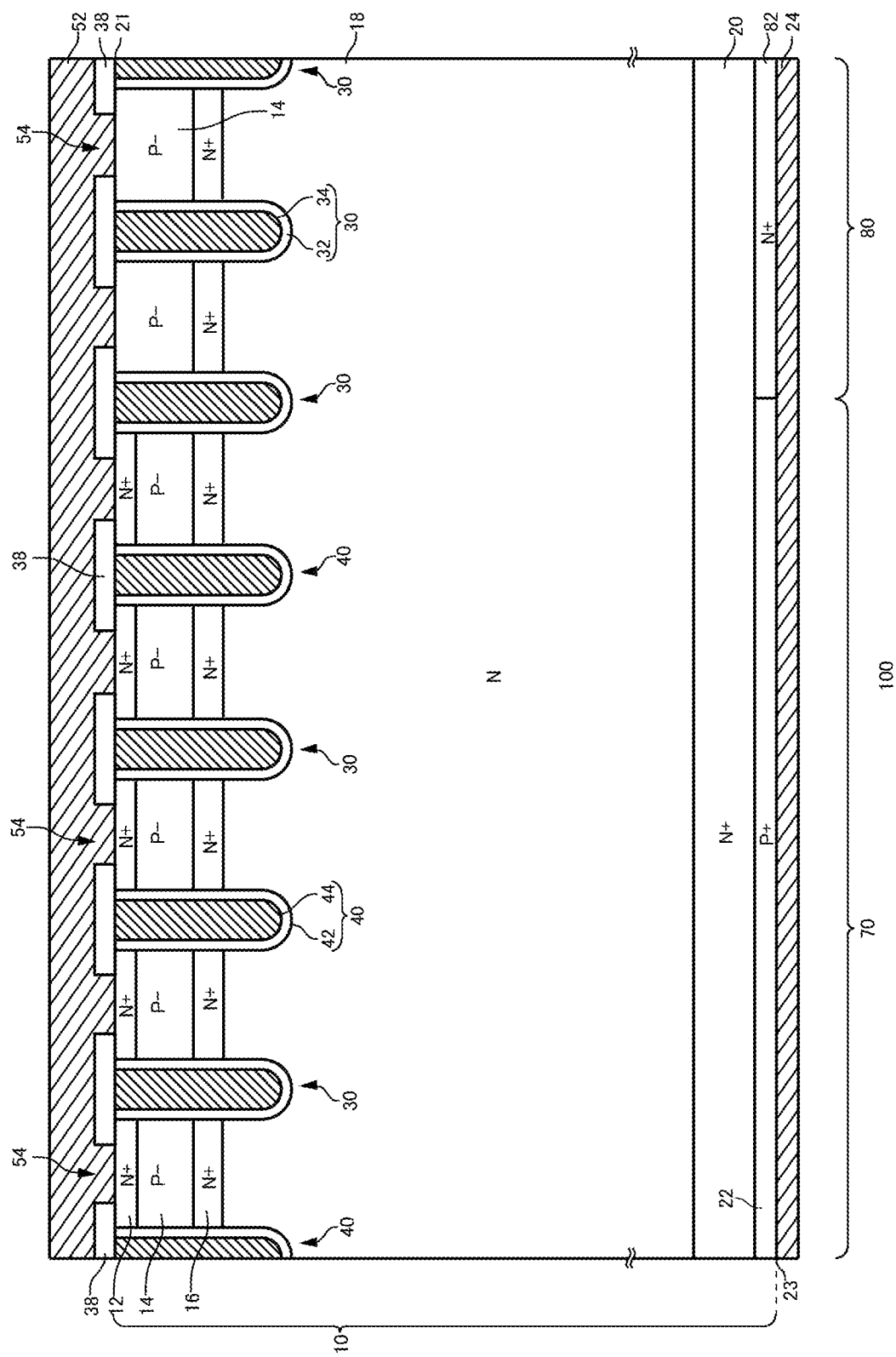
FIG. 7 shows an example of a cross section of a partial region of the semiconductor device 100.

FIG. 7 shows an example of a cross section of a partial region of the semiconductor device 100. The semiconductor device 100 in this example is an RC-IGBT semiconductor chip including an IGBT 70 and an FWD 80. The IGBT 70 is an example of the transistor 104 (see FIG. 1), and the FWD 80 is an example of the diode 105 (see FIG. 1). The semiconductor device 100 includes a semiconductor substrate 10, an interlayer dielectric film 38, an emitter electrode 52, and a collector electrode 24. The semiconductor substrate 10 is a substrate formed of a semiconductor material such as silicon, silicon carbide, or gallium nitride. The IGBT 70 and the FWD 80 may be provided side by side in the semiconductor substrate 10.

The interlayer dielectric film 38 is provided on an upper surface of the semiconductor substrate 10. The interlayer dielectric film 38 is a film including at least one layer of a dielectric film such as silicate glass to which an impurity such as boron or phosphorus is added, a thermal oxide film, and other dielectric films. The interlayer dielectric film 38 is provided with a contact hole 54.

The emitter electrode 52 is provided above the interlayer dielectric film 38. The emitter electrode 52 is electrically connected to the second main terminal 102 (see FIG. 1). The emitter electrode 52 is in contact with an upper surface 21 of the semiconductor substrate 10 through the contact hole 54 of the interlayer dielectric film 38. The collector electrode 24 is electrically connected to the first main terminal 101 (see FIG. 1). The collector electrode 24 is provided on a lower surface 23 of the semiconductor substrate 10. The emitter electrode 52 and the collector electrode 24 are formed of a metallic material such as aluminum.

The semiconductor substrate 10 includes an N type drift region 18. The drift region 18 is provided in each of the IGBT and the FWD 80

The IGBT 70 is provided with an N+ type emitter region 12 and a P-type base region 14 in this order from the upper surface 21 side of the semiconductor substrate 10. The drift region 18 is provided below the base region 14. The IGBT 70 may be provided with an N+ type accumulation region 16. The accumulation region 16 is disposed between the base region 14 and the drift region 18.

The accumulation region 16 is an N+ type region having a doping concentration higher than that of the drift region 18. Providing the highly-concentrated accumulation region 16 between the drift region 18 and the base region 14 can increase a carrier injection-enhancement effect (IE effect) to reduce an ON-voltage.

The FWD 80 is provided with the P-type base region 14 in contact with the upper surface 21 of the semiconductor substrate 10. The drift region 18 is provided below the base region 14. In the FWD 80, the accumulation region 16 may be provided below the base region 14.

In each of the IGBT 70 and the FWD 80, an N+ type buffer region 20 may be provided below the drift region 18. The buffer region 20 has a doping concentration higher than that of the drift region 18. The buffer region 20 may serve as a field stop layer which prevents a depletion layer spreading from a lower end of the base region 14 from reaching a P+ type collector region 22 and an N+ type cathode region 82.

In the IGBT 70, the P+ type collector region 22 is provided below the buffer region 20. The collector region 22 has an acceptor concentration higher than that of the base region 14. In the FWD 80, the N+ type cathode region 82 is provided below the buffer region 20. The cathode region 82 has a donor concentration higher than that of the drift region 18. The collector region 22 and the cathode region 82 are exposed to the lower surface 23 of the semiconductor substrate 10, and are connected to the collector electrode 24. The collector electrode 24 may be in contact with the entirety of the lower surface 23 of the semiconductor substrate 10.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10 to reach the drift region 18. In a region where at least one of the emitter region 12 and the accumulation region 16 is provided, each trench portion also passes through these doping regions to reach the drift region 18.

The IGBT 70 is provided with a gate trench portion 40 and a dummy trench portion 30. The FWD 80 is provided with a dummy trench portion 30, and is not provided with a gate trench portion 40.

The gate trench portion 40 includes a gate trench, a gate dielectric film 42, and a gate conductive portion 44 which are provided on the upper surface 21 of the semiconductor substrate 10. The gate conductive portion 44 is provided farther inward than the gate dielectric film 42 inside the gate trench. That is, the gate dielectric film 42 insulates the gate conductive portion 44 and the semiconductor substrate 10. The gate conductive portion 44 is formed of a conductive material such as polysilicon.

The gate conductive portion 44 may be provided to be longer than the base region 14 in the depth direction. The gate trench portion 40 in this cross section is covered with the interlayer dielectric film 38 on the upper surface 21 of the semiconductor substrate 10. The gate conductive portion 44 is electrically connected to the control terminal 103 (see FIG. 1). When a predetermined ON-voltage is applied to the gate conductive portion 44, a channel due to an electron inversion layer is formed in a surface layer of an interface of the base region 14 in contact with the gate trench portion 40. This brings the IGBT 70 into the ON-state where a current flows between the collector electrode 24 and the emitter electrode 52. Moreover, when a predetermined OFF-voltage is applied to the gate conductive portion 44, the IGBT 70 is turned off.

The dummy trench portion 30 may have the same structure as that of the gate trench portion 40 in this cross section. The dummy trench portion 30 includes a dummy trench, a dummy dielectric film 32, and a dummy conductive portion 34 which are provided on the upper surface 21 of the semiconductor substrate 10. The dummy conductive portion 34 is electrically connected to the emitter electrode 52. The dummy dielectric film 32 insulates the dummy conductive portion 34 and the semiconductor substrate 10. The dummy conductive portion 34 is formed of a conductive material such as polysilicon.

The operations, procedures, steps, and steps of each process conducted by an apparatus, system, program, and method shown in the claims, embodiments, or diagrams can be conducted in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be conducted in this order.

What is claimed is:

1. A testing apparatus for testing a semiconductor device including a first main terminal to which a first power source voltage is applied and a second main terminal to which a second power source voltage lower than the first power source voltage is applied, comprising:
    a condition setting unit configured to set a changing speed of a terminal voltage of the first main terminal at turn-off of the semiconductor device;
    an operation controlling unit configured to turn off the semiconductor device under a condition set by the condition setting unit; and
    a determining unit configured to screen the semiconductor device based on an operation result of the semiconductor device, wherein:
        a time waveform of the terminal voltage at turn-off of the semiconductor device includes a maximum changing point where the changing speed becomes maximum; and
        the condition setting unit is configured to set the changing speed at a first set voltage higher than a voltage at the maximum changing point, to a first predetermined value.

2. The testing apparatus according to claim 1, wherein the first set voltage is a voltage equal to or higher than 80% of the first power source voltage.

3. The testing apparatus according to claim 2, wherein the first set voltage is a voltage equal to or higher than the first power source voltage.

4. The testing apparatus according to claim 3, wherein the first set voltage is the same voltage as the first power source voltage.

5. The testing apparatus according to claim 1, wherein:
    the testing apparatus is configured to test the semiconductor device in each of two cases: a case where the semiconductor device is in a chip state and a case where it is in a module state; and
    the condition setting unit is configured to set the changing speed at the first set voltage when testing the semiconductor device in the chip state, higher than the changing speed at the first set voltage when testing the semiconductor device in the module state.

6. The testing apparatus according to claim 2, wherein:
    the testing apparatus is configured to test the semiconductor device in each of two cases: a case where the semiconductor device is in a chip state and a case where it is in a module state; and
    the condition setting unit is configured to set the changing speed at the first set voltage when testing the semiconductor device in the chip state, higher than the changing speed at the first set voltage when testing the semiconductor device in the module state.

7. The testing apparatus according to claim 3, wherein:
    the testing apparatus is configured to test the semiconductor device in each of two cases: a case where the semiconductor device is in a chip state and a case where it is in a module state; and
    the condition setting unit is configured to set the changing speed at the first set voltage when testing the semiconductor device in the chip state, higher than the changing speed at the first set voltage when testing the semiconductor device in the module state.

8. The testing apparatus according to claim 4, wherein:
    the testing apparatus is configured to test the semiconductor device in each of two cases: a case where the semiconductor device is in a chip state and a case where it is in a module state; and
    the condition setting unit is configured to set the changing speed at the first set voltage when testing the semiconductor device in the chip state, higher than the changing speed at the first set voltage when testing the semiconductor device in the module state.

9. The testing apparatus according to claim 5, wherein the condition setting unit is configured to adjust the changing speed at the first set voltage for the semiconductor device in the chip state according to a result of screening the semiconductor device in the module state.

10. The testing apparatus according to claim 9, wherein the condition setting unit is configured to increase the changing speed at the first set voltage for the semiconductor device in the chip state, when a fraction defective in the semiconductor device in the module state is increased.

11. The testing apparatus according to claim 1, wherein the condition setting unit is further configured to set the changing speed at a second set voltage different from the first set voltage, to a second predetermined value.

12. The testing apparatus according to claim 2, wherein the condition setting unit is further configured to set the changing speed at a second set voltage different from the first set voltage, to a second predetermined value.

13. The testing apparatus according to claim 3, wherein the condition setting unit is further configured to set the changing speed at a second set voltage different from the first set voltage, to a second predetermined value.

14. The testing apparatus according to claim 4, wherein the condition setting unit is further configured to set the changing speed at a second set voltage different from the first set voltage, to a second predetermined value.

15. The testing apparatus according to claim 5, wherein the condition setting unit is further configured to set the changing speed at a second set voltage different from the first set voltage, to a second predetermined value.

16. The testing apparatus according to claim 9, wherein the condition setting unit is further configured to set the changing speed at a second set voltage different from the first set voltage, to a second predetermined value.

17. The testing apparatus according to claim 10, wherein the condition setting unit is further configured to set the changing speed at a second set voltage different from the first set voltage, to a second predetermined value.

18. The testing apparatus according to claim 11, wherein the second set voltage is lower than the first set voltage.

19. A testing method for testing a semiconductor device including a first main terminal to which a first power source voltage is applied and a second main terminal to which a second power source voltage lower than the first power source voltage is applied, comprising:
- a condition setting step of setting a changing speed of a terminal voltage of the first main terminal at turn-off of the semiconductor device;
- an operation controlling step of turning off the semiconductor device under a condition set in the condition setting step; and
- a determining step of screening the semiconductor device based on an operation result of the semiconductor device, wherein:
  - a time waveform of the terminal voltage at turn-off of the semiconductor device includes a maximum changing point where the changing speed becomes maximum; and
  - in the condition setting step, the changing speed at a first set voltage higher than a voltage at the maximum changing point is set to a predetermined value.

20. A manufacturing method of a semiconductor module having a semiconductor device including a first main terminal to which a first power source voltage is applied and a second main terminal to which a second power source voltage lower than the first power source voltage is applied, comprising:
- a testing step of testing the semiconductor device in a chip state; and
- an incorporating step of incorporating into a module the semiconductor device sorted in the testing step so as to form the semiconductor module, wherein:
  - the testing step includes:
    - a condition setting step of setting a changing speed of a terminal voltage of the first main terminal at turn-off of the semiconductor device;
    - an operation controlling step of turning off the semiconductor device under a condition set in the condition setting step; and
    - a determining step of screening the semiconductor device based on an operation result of the semiconductor device;
  - a time waveform of the terminal voltage at turn-off of the semiconductor device includes a maximum changing point where the changing speed becomes maximum; and
  - in the condition setting step, the changing speed at a first set voltage higher than a voltage at the maximum changing point is set to a predetermined value.

* * * * *